(12) United States Patent
Konno et al.

(10) Patent No.: US 12,148,716 B2
(45) Date of Patent: Nov. 19, 2024

(54) SEMICONDUCTOR DEVICE

(71) Applicant: KIOXIA CORPORATION, Tokyo (JP)

(72) Inventors: Takuya Konno, Yokkaichi Mie (JP); Sachiyo Ito, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 323 days.

(21) Appl. No.: 17/679,896

(22) Filed: Feb. 24, 2022

(65) Prior Publication Data

US 2023/0062835 A1 Mar. 2, 2023

(30) Foreign Application Priority Data

Aug. 26, 2021 (JP) .................................. 2021-137923

(51) Int. Cl.
*H01L 23/00* (2006.01)
*H01L 25/00* (2006.01)
(Continued)

(52) U.S. Cl.
CPC ............ *H01L 23/562* (2013.01); *H01L 24/08* (2013.01); *H01L 24/80* (2013.01); *H01L 25/0657* (2013.01); *H01L 25/18* (2013.01); *H01L 25/50* (2013.01); *H01L 2224/08145* (2013.01); *H01L 2224/80895* (2013.01); *H01L 2224/80896* (2013.01); *H01L 2924/01013* (2013.01); *H01L 2924/01022* (2013.01); *H01L 2924/01029* (2013.01); *H01L 2924/01042* (2013.01); *H01L 2924/01073* (2013.01); *H01L 2924/01074* (2013.01); *H01L 2924/04941* (2013.01); *H01L 2924/04953* (2013.01); *H01L 2924/05032* (2013.01); *H01L 2924/05042* (2013.01); *H01L 2924/0534* (2013.01); *H01L 2924/05341* (2013.01); *H01L 2924/05342* (2013.01); *H01L 2924/05432* (2013.01); *H01L 2924/1431* (2013.01); *H01L 2924/14511* (2013.01); *H01L 2924/3511* (2013.01)

(58) Field of Classification Search
CPC ....... H01L 23/562; H01L 24/08; H01L 24/80; H01L 25/0657
See application file for complete search history.

(56) References Cited

U.S. PATENT DOCUMENTS 8,119,498 B2 2/2012 Mengi et al.
9,583,676 B2 2/2017 De Samber et al.
(Continued)

FOREIGN PATENT DOCUMENTS

| CN | 109905957 A | 6/2019 |
| JP | 2012186309 A | 9/2012 |

(Continued)

*Primary Examiner* — Nathan W Ha
(74) *Attorney, Agent, or Firm* — Kim & Stewart LLP

(57) ABSTRACT

According to one embodiment, a semiconductor device includes a first substrate, a second substrate joined to the first substrate. A first region of the semiconductor device that includes a peripheral circuit is between the first substrate and the second substrate. A second region that includes a memory cell array is between the first region and the second substrate. A layer that is embedded in the second substrate has a Young's modulus that is higher than that of silicon and/or an internal stress that is higher than that of silicon oxide.

20 Claims, 15 Drawing Sheets

(51) Int. Cl.
    *H01L 25/065*   (2023.01)
    *H01L 25/18*    (2023.01)

(56)         References Cited

U.S. PATENT DOCUMENTS

| | | | |
|---|---|---|---|
| 10,483,188 B2 | 11/2019 | Ait-Mani et al. | |
| 10,529,736 B2 | 1/2020 | Song et al. | |
| 2012/0032323 A1 | 2/2012 | Matsumoto | |
| 2020/0251484 A1* | 8/2020 | Ito | H10B 43/30 |
| 2020/0286913 A1 | 9/2020 | Noguchi | |
| 2020/0294970 A1 | 9/2020 | Uh | |
| 2021/0043234 A1 | 2/2021 | Tanaka et al. | |
| 2021/0104472 A1 | 4/2021 | Shimamoto | |
| 2021/0134819 A1* | 5/2021 | Zhang | H10B 41/50 |
| 2021/0159216 A1* | 5/2021 | Wu | H01L 21/8221 |
| 2021/0202458 A1* | 7/2021 | Jung | H10B 43/27 |
| 2021/0202580 A1 | 7/2021 | Noda | |
| 2021/0296253 A1* | 9/2021 | Wakatsuki | H01L 24/05 |
| 2021/0296299 A1* | 9/2021 | Shibata | H01L 24/05 |
| 2021/0313246 A1* | 10/2021 | Matsumura | H10B 43/40 |
| 2021/0327838 A1* | 10/2021 | Hou | H01L 24/03 |
| 2021/0375915 A1* | 12/2021 | Zhang | H10B 43/40 |
| 2022/0037267 A1* | 2/2022 | Zhang | H01L 25/18 |
| 2022/0108963 A1* | 4/2022 | Hwang | H10B 80/00 |
| 2022/0130855 A1* | 4/2022 | Lee | H10B 41/43 |
| 2022/0181273 A1* | 6/2022 | Kwon | H10B 43/40 |
| 2022/0199670 A1* | 6/2022 | Jang | H01L 27/14636 |
| 2022/0208705 A1* | 6/2022 | Chen | H01L 25/0657 |
| 2022/0208748 A1* | 6/2022 | Rabkin | H01L 24/80 |
| 2022/0285234 A1* | 9/2022 | Yokomizo | H01L 24/80 |
| 2022/0285434 A1* | 9/2022 | Shen | H01L 25/50 |
| 2022/0293556 A1* | 9/2022 | Li | H01L 23/544 |
| 2022/0302149 A1* | 9/2022 | Zhang | H10B 43/40 |
| 2022/0310644 A1* | 9/2022 | Lee | H10B 41/41 |
| 2022/0352104 A1* | 11/2022 | Hou | H10B 41/27 |
| 2022/0359441 A1* | 11/2022 | Hasnat | H10B 43/40 |
| 2022/0359599 A1* | 11/2022 | Iijima | H01L 27/146 |
| 2022/0367415 A1* | 11/2022 | Huang | H01L 24/80 |
| 2022/0392942 A1* | 12/2022 | Tojinbara | H04N 25/79 |
| 2023/0005854 A1* | 1/2023 | Simsek-Ege | H01L 21/2007 |
| 2023/0178577 A1* | 6/2023 | Bairo | H01L 27/14634 |
| | | | 257/444 |

FOREIGN PATENT DOCUMENTS

| | | |
|---|---|---|
| JP | 2015501536 A | 1/2015 |
| JP | 6100789 B2 | 3/2017 |
| JP | 2020145279 A | 9/2020 |
| JP | 2021028950 A | 2/2021 |
| TW | 201110244 A | 3/2011 |
| TW | 202034415 A | 9/2020 |
| TW | 202101714 A | 1/2021 |

* cited by examiner

SEMICONDUCTOR DEVICE

CROSS-REFERENCE TO RELATED APPLICATION

This application is based upon and claims the benefit of priority from Japanese Patent Application No. 2021-137923, filed Aug. 26, 2021, the entire contents of which are incorporated herein by reference.

FIELD

Embodiments described herein relate generally to a semiconductor device.

BACKGROUND

In recent years, semiconductor storage devices that are formed by joining a first semiconductor chip having a memory cell array thereon and a second semiconductor chip having a peripheral circuit thereon have been developed.

DETAILED DESCRIPTION

Figure 1:
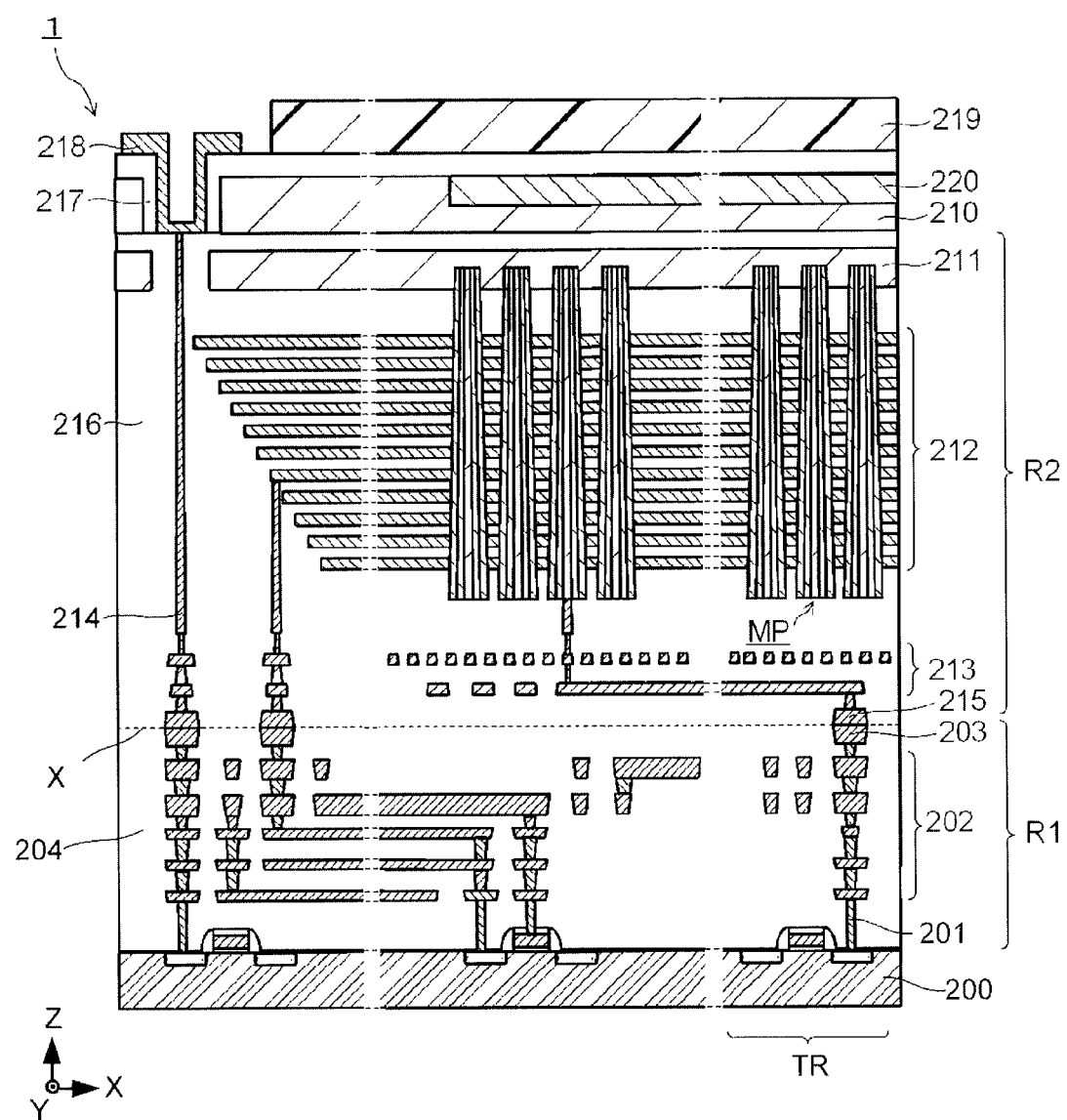
FIG. 1 is a schematic view of an X-Z cross section illustrating a structural example of a semiconductor device.

Certain example embodiments provide a semiconductor device having reduced warpage.

In general, according to one embodiment, a semiconductor device includes a first substrate and a second substrate joined to the first substrate. There is a first region that includes therein a peripheral circuit. The first region is between the first substrate and the second substrate. There is a second region that includes therein a memory cell array. The second region is between the first region and the second substrate. A layer is embedded in the second substrate in a region overlapping the memory cell array. The layer has a Young's modulus that is higher than that of silicon and/or an internal stress that is higher than that of silicon oxide.

Hereinafter, example embodiments will be described with reference to drawings. The depicted relationships between the dimensions of each component in the drawings, the ratios of dimensions between different depicted components in the drawings, and the like may differ from those of an actual device implementation. In the drawings, components that are substantially the same as one another are denoted by the same reference numerals, and particular description thereof may be omitted in description of subsequent drawings and/or example embodiments.

Structural Example of a Semiconductor Device

FIG. 1 is a schematic view of an X-Z cross section of a semiconductor device 1. A semiconductor device 1 illustrated in FIG. 1 is a three-dimensional stacked semiconductor storage device or the like.

The semiconductor device 1 includes a substrate 200, transistors TR provided on the substrate 200, a conductive layer 201, a multilayer wiring 202, a conductive layer 203, an interlayer insulating film 204, a substrate 210, a conductive layer 211, a stacked body 212, memory pillars MP, a multilayer wiring 213, a conductive layer 214, a conductive layer 215, an interlayer insulating film 216, an interlayer insulating film 217, a conductive layer 218, and a passivation film 219.

The substrate 200 is a semiconductor substrate such as a silicon substrate.

The transistor TR is an N-channel field-effect transistor or a P-channel field-effect transistor. Although FIG. 1 illustrates three transistors TR, the number transistors TR is not limited to the number of transistors TR illustrated in FIG. 1.

The plurality of transistors TR form, for example, a peripheral circuit of a semiconductor storage device. The peripheral circuit is disposed in a region R1 between the substrate 200 and the substrate 210. The transistors TR may be electrically separated from each other by an element separator such as shallow trench isolation (STI).

The conductive layer 201 includes a contact plug. Portions (e.g., individual wires) of the multilayer wiring 202 can be electrically coupled to the gate, source, and drain of the transistors TR via the conductive layer 201 as necessary for purposes of forming circuit components or the like. The conductive layer 201 and the multilayer wiring 202 contain a metallic material.

The conductive layer 203 includes a coupling pad. The coupling pad of the conductive layer 203 is electrically coupled to the conductive layer 201 via the multilayer wiring 202. The conductive layer 203 contains a metallic material.

The interlayer insulating film 204 covers the transistors TR, the conductive layer 201, and the multilayer wiring 202. An example of the interlayer insulating film 204 is a silicon oxide film.

The substrate 210 is a semiconductor substrate such as a silicon substrate.

The conductive layer 211 is disposed between the substrate 210 and the stacked body 212. The conductive layer 211 functions as the source line of the semiconductor storage device. The conductive layer 211 contains, for example, a metallic material. The conductive layer 211 does not necessarily have to be provided in every example.

The stacked body 212 is provided in a region R2 between the region R1 and the substrate 210. The stacked body 212 includes a plurality of insulating layers and a plurality of conductive layers alternately stacked in a Z-axis direction. The Z-axis direction is, for example, the thickness direction of the substrate 200.

As illustrated in FIG. 1, the memory pillars MP extend through the stacked body 212 in the Z-axis direction. Although FIG. 1 illustrates seven memory pillars MP, the number of a plurality of memory pillars MP is not limited to the number illustrated in FIG. 1. The stacked body 212 and the plurality of memory pillars MP therein form a memory cell array of the semiconductor storage device. The memory cell array is thus disposed in the region R2 between the region R1 and the substrate 210. In FIG. 1, the memory cell array including the memory pillars MP overlaps (that is, is above in the Z direction) the peripheral circuit including the transistors TR, but the present embodiment is not limited thereto, and the memory cell array does not necessarily have to overlap the peripheral circuit.

Figure 2:
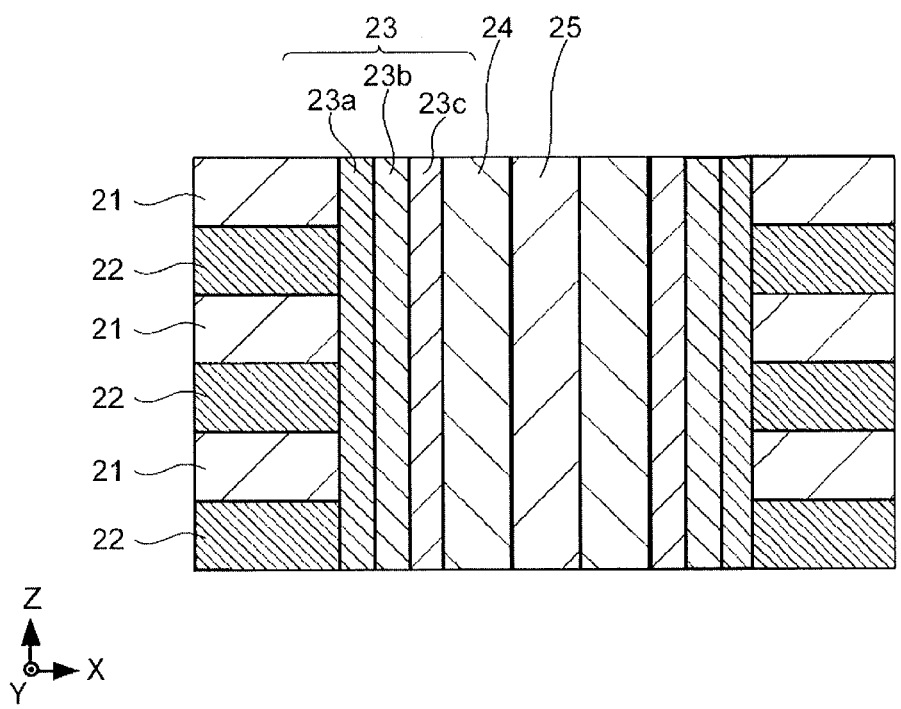
FIG. 2 is a schematic view of the X-Z cross section illustrating a structural example of a memory pillar.

FIG. 2 is a schematic view of the X-Z cross section illustrating a structural example of a memory pillar MP. FIG. 2 illustrates an insulating layer 21, a conductive layer 22, a memory layer 23, a semiconductor layer 24, and a core insulator 25.

The insulating layer 21 and the conductive layer 22 are portions of the stacked body 212 illustrated in FIG. 1. A plurality of conductive layers 22 form word lines of the semiconductor storage device. The insulating layer 21 contains, for example, silicon oxide. The conductive layer 22 contains a metallic material.

The memory layer 23 includes a block insulating film 23a, a charge storage film 23b, and a tunnel insulating film 23c. The block insulating film 23a and the tunnel insulating film 23c comprise, for example, silicon oxide. The charge storage film 23b comprises, for example, a silicon nitride.

The semiconductor layer 24 penetrates the stacked body 212 along the Z-axis direction. The semiconductor layer 24 is electrically coupled to the conductive layer 211. The outer circumference of the semiconductor layer 24 is covered with the memory layer 23. The semiconductor layer 24 contains, for example, polycrystalline silicon.

The core insulator 25 is provided inside the semiconductor layer 24. The core insulator 25 extends along the semiconductor layer 24. The core insulator 25 comprises, for example, silicon oxide.

The intersection of the memory pillar MP and a conductive layer 22 functions as a memory transistor. The memory transistor is a memory cell of the memory cell array.

The multilayer wiring 213 is electrically coupled to the conductive layer 214. The multilayer wiring 213 includes the bit lines of the semiconductor storage device. Each bit line is coupled to at least one of the memory pillars MP via a plug. The multilayer wiring 213 contains a metallic material.

The conductive layer 214 includes plugs. At least one of the plugs of the conductive layer 214 electrically couples the conductive layer 218 and the peripheral circuit. At least another one of the plugs of the conductive layer 214 electrically couples a memory transistor to a transistor TR. The number of plugs is not limited to the number of plugs illustrated in FIG. 1.

The conductive layer 215 includes a coupling pad. The coupling pad of the conductive layer 215 is electrically coupled to the multilayer wiring 213 via a plug. The conductive layer 215 contains a metallic material.

The coupling pad of the conductive layer 215 is joined to the coupling pad of the conductive layer 203. Thereby, for example, the memory cell array (the stacked body 212 and the memory pillar MP) and the peripheral circuit (including the transistors TR) are electrically coupled.

The interlayer insulating film 216 covers the surface of the substrate 210 on the memory pillar MP side. The interlayer insulating film 216 covers the conductive layer 211, the stacked body 212, the memory pillar MP, the multilayer wiring 213, and the conductive layer 214, and the surface facing the interlayer insulating film 204 is flattened. An example of the interlayer insulating film 216 is a silicon oxide film.

The interlayer insulating film 217 covers the surface of the substrate 210 opposite to the memory pillar MP. An example of the interlayer insulating film 217 is a silicon oxide film.

The conductive layer 218 includes a bonding pad. The coupling portion of the bonding pad penetrates the substrate 210 in the Z-axis direction. The conductive layer 218 contains a metallic material such as aluminum.

The passivation film 219 is provided on the interlayer insulating film 217. The passivation film 219 is formed, for example, by stacking a silicon oxide layer, a silicon nitride layer, and a polyimide layer in this order above the interlayer insulating film 217.

Figure 3:
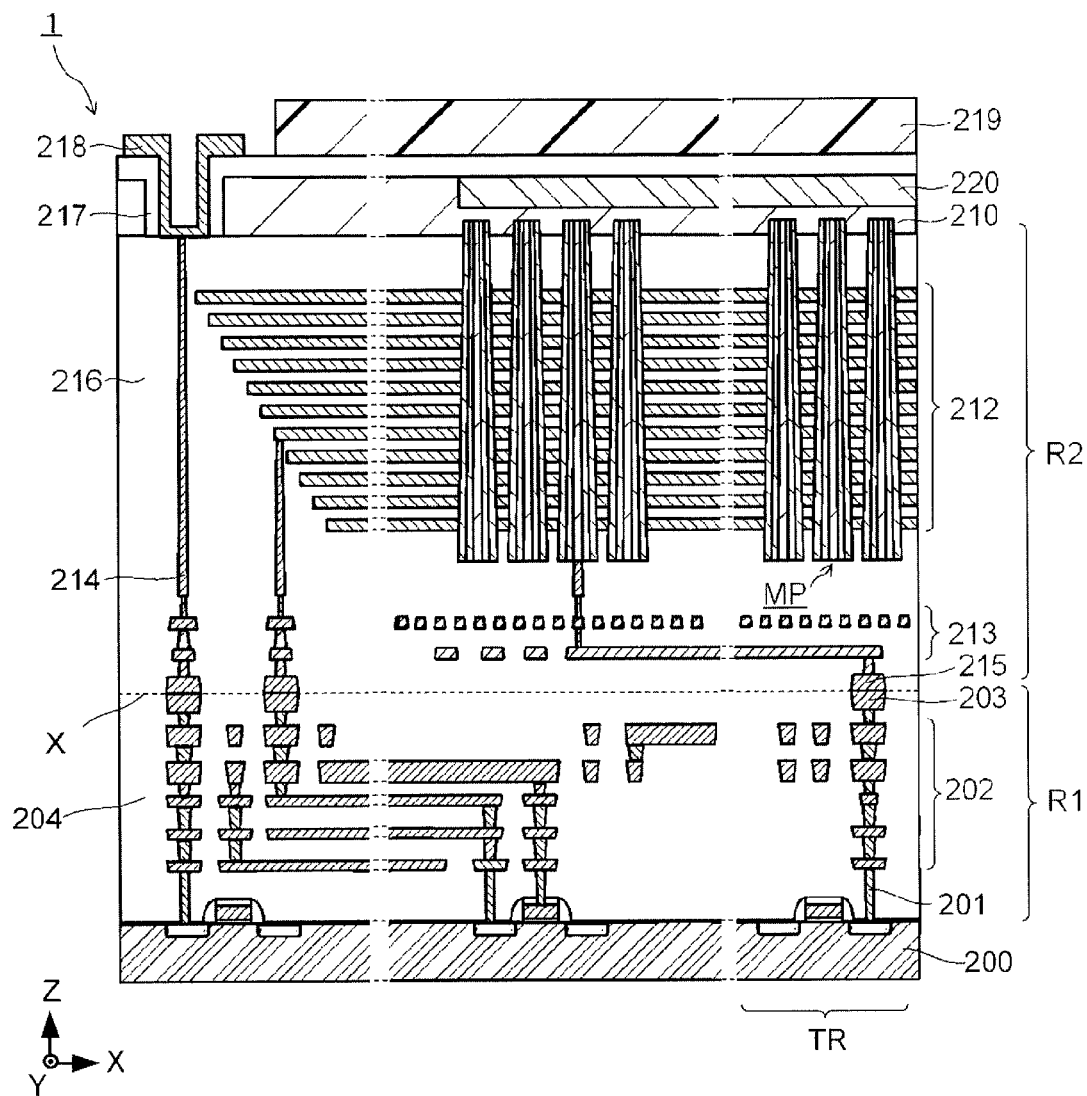
FIG. 3 is a schematic view of the X-Z cross section illustrating another structural example of the semiconductor device.

The structure of the semiconductor device 1 is not limited to the structure illustrated in FIG. 1. FIG. 3 is a schematic view of the X-Z cross section illustrating another structural example of a semiconductor device. The semiconductor device 1 illustrated in FIG. 3 is different from the semiconductor device 1 illustrated in FIG. 1 in that the conductive layer 211 is not provided. The semiconductor layer 24 of the memory pillar MP is electrically coupled to the substrate 210. Thus, the substrate 210 functions as a source line of the semiconductor storage device. For other parts, the description of the semiconductor device 1 illustrated in FIG. 1 are in substantial correspondence.

In a three-dimensional stacked semiconductor storage device of the related art, there is a problem that warpage increases as the stacking increases. This warpage causes defects such as package defects.

A method of forming a predetermined pattern on a wiring layer or a passivation film to reduce warpage is known. However, when a first semiconductor chip having a memory cell array and a second semiconductor chip having a peripheral circuit are joined to manufacture a three-dimensional stacked semiconductor storage device, since the warped state may differ between the first semiconductor chip and the second semiconductor chip, the warpage of the combined chip after dicing may have a complicated shape. Therefore, it is difficult to sufficiently reduce the warpage only by forming a predetermined pattern on the wiring layer or the passivation film.

On the other hand, the semiconductor device 1 further includes a layer 220 embedded in the substrate 210, as illustrated in FIGS. 1 and 3. The layer 220 has a function as a support layer for reducing the warpage of the semiconductor device 1.

The layer 220 has a Young's modulus higher than that of silicon and/or has an internal stress higher than that of silicon oxide. The layer 220 is provided on the surface of the substrate 210 opposite to the memory pillar MP. Therefore, the layer 220 overlaps the memory cell array in the Z-axis direction. The layer 220 does not necessarily have to overlap the peripheral circuit in the Z-axis direction in all cases.

Deformation of the semiconductor device 1 can be reduced by setting the Young's modulus of the layer 220 to be higher than the Young's modulus of silicon. Therefore, the warpage of the semiconductor device 1 can be reduced. The layer 220 preferably has a Young's modulus higher than that of the substrate 210, for example.

Examples of internal stress of the layer 220 are compressive stress and tensile stress. By making the compressive stress of the layer 220 larger than the compressive stress of silicon oxide, it is possible to prevent the semiconductor device 1 from warping downward (to the substrate 200 side) in a convex shape. Further, by making the tensile stress of the layer 220 larger than the tensile stress of silicon oxide, it is possible to prevent the semiconductor device 1 from warping upward (to the substrate 210 side) in a convex shape. The layer 220 preferably has an internal stress higher than that of the interlayer insulating film 217, for example.

Examples of the layer 220 include a silicon nitride layer, a metal oxide layer, a metal nitride layer, a metal layer, and the like.

A silicon nitride film can impart a tensile stress or compressive stress higher than that of a silicon oxide film by controlling the film forming conditions.

Examples of the metal oxide used for the metal oxide layer include aluminum oxide, titanium oxide, zirconium oxide, hafnium oxide and the like. These metal oxides have a Young's modulus higher than that of silicon and can impart a tensile stress or compressive stress higher than that of silicon oxide by control of the film forming conditions.

Examples of the metal nitride used for the metal nitride layer include aluminum nitride, titanium nitride, tantalum nitride, and the like. These metal nitrides have a Young's modulus higher than that of silicon and can impart a tensile stress or compressive stress higher than that of silicon oxide by control of the film forming conditions.

Examples of the metal used for the metal layer include tungsten, titanium, aluminum, copper, molybdenum, and tantalum, and alloys thereof. Tungsten has a Young's modulus higher than that of silicon and can impart a tensile stress or compressive stress higher than that of silicon oxide by controlling the film forming conditions. Titanium, aluminum, copper and tantalum can impart a tensile stress higher than that of silicon oxide. Molybdenum has a Young's modulus higher than that of silicon and can impart a tensile stress higher than that of silicon oxide.

The coefficient of linear thermal expansion of the layer 220 is preferably substantially the same as the coefficient of linear thermal expansion of silicon. By reducing the difference in the coefficient of linear thermal expansion between the layer 220 and the substrate 210, deformation of the semiconductor device 1 can be reduced even when heat is applied to the semiconductor device 1 by heat treatment in a post-process such as packaging. Therefore, the warpage of the semiconductor device 1 can be further reduced. The coefficient of linear thermal expansion for the material used as the layer 220 preferably is close to that to silicon. For example, silicon nitride, aluminum nitride, tungsten, and tantalum are particularly preferable because of each has substantially the same coefficient of linear thermal expansion as silicon.

First Structural Example of Layer 220

Figure 4:
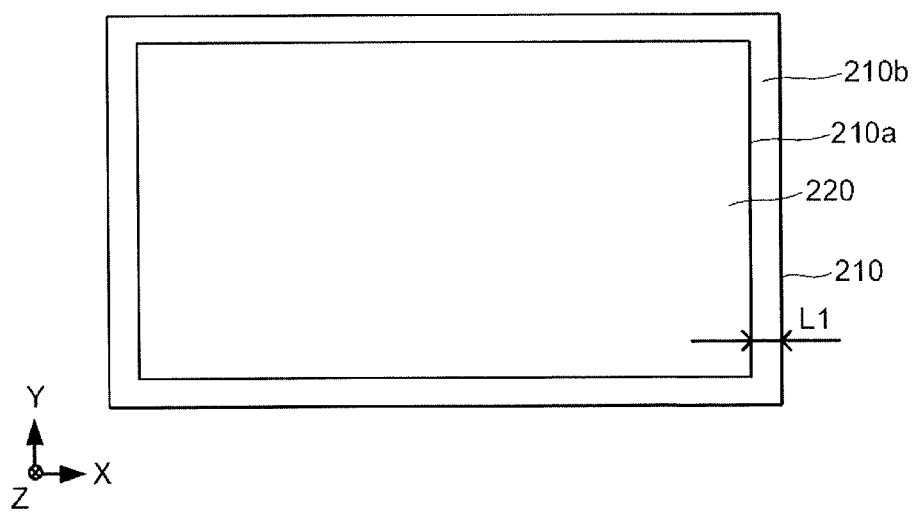
FIG. 4 is a schematic view of an X-Y plane illustrating a first structural example of a layer.
Figure 5:
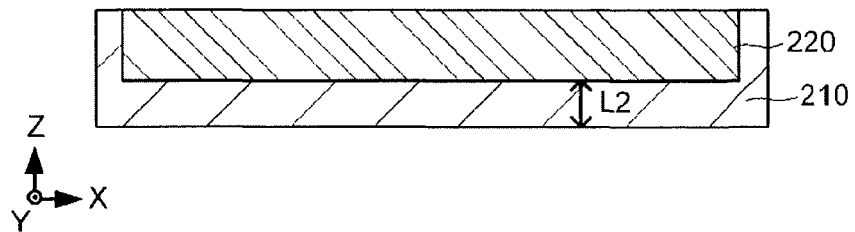
FIG. 5 is a schematic view of the X-Z cross section illustrating the first structural example of the layer.

FIG. 4 is a schematic view of the X-Y plane illustrating a first structural example of the layer 220. FIG. 5 is a schematic view of the X-Z cross section illustrating a first structural example of the layer 220. The X-Y plane is parallel to the substrate surface of the substrate 210.

The layer 220 may be formed over an entire region 210a of the substrate 210, as illustrated in FIG. 4. In this example, the layer 220 is not formed in a region 210b. The region 210a is surrounded by the region 210b along the X-Y plane and overlaps the memory cell array including the memory pillar MP. By not forming the layer 220 in the region 210b, it is possible to prevent the layer 220 from peeling off from the substrate 210 even when warpage occurs. In FIG. 4, a width L1 of the region 210b is not particularly limited, and may be, for example, 100 μm or less.

As illustrated in FIG. 5, a thickness L2 of the portion of the substrate 210 facing the lower surface of the layer 220 is not particularly limited, and may be, for example, 1 μm or less.

Figure 6:
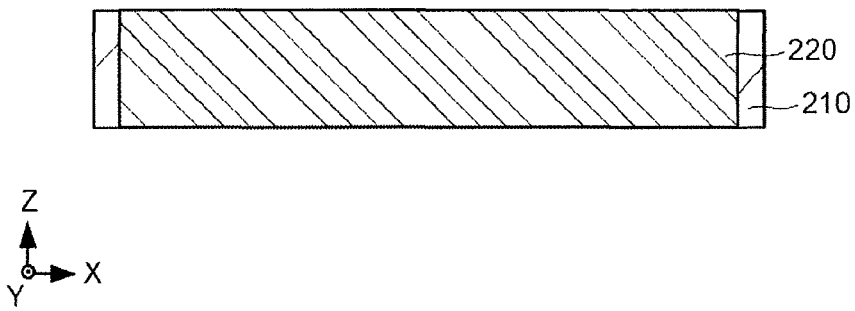
FIG. 6 is a schematic view of the X-Z cross section illustrating a modification example of the first structural example of the layer.

FIG. 6 is a schematic view of the X-Z cross section illustrating a modification example of the first structural example of the layer 220. The layer 220 may penetrate the substrate 210 in the Z-axis direction, as illustrated in FIG. 6. By increasing the volume of the layer 220, the warpage of the semiconductor device 1 can be further reduced. The structure illustrated in FIG. 6 may be applied when the memory pillar MP is electrically coupled to the conductive layer 211 as in the semiconductor device 1 illustrated in FIG. 1, for example.

A structure having the layer 220 over the entire region 210a, as illustrated in FIG. 4, can effectively reduce warpage in both an X-axis direction and a Y-axis direction. Therefore, for example, it is suitable when the semiconductor device 1 warps upward (to the substrate 210 side) in a convex shape in one of the X-axis direction and the Y-axis direction, and the semiconductor device 1 warps downward (to the substrate 200 side) in a concave shape in the other one of the X-axis direction and the Y-axis direction. When the conductive layer 218 illustrated in FIG. 1 penetrates the layer 220 of the substrate 210, a non-conductive material other than a metal is preferably used for the layer 220. By using a non-conductive material for the layer 220, electrical interference between the bonding pad provided by the conductive layer 218 and the substrate 210 can be effectively reduced.

Second Structural Example of Layer 220

Figure 7:
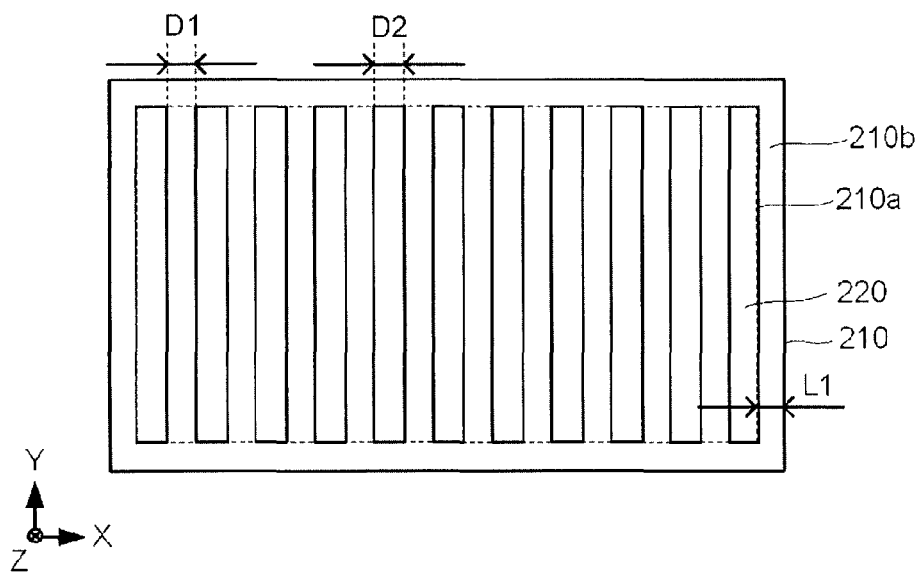
FIG. 7 is a schematic view of the X-Y plane illustrating a second structural example of the layer.
Figure 8:
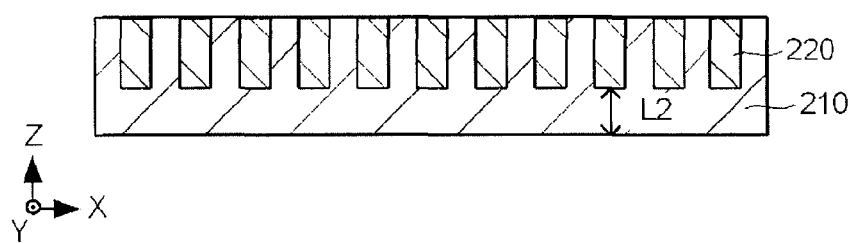
FIG. 8 is a schematic view of the X-Z cross section illustrating the second structural example of the layer.

FIG. 7 is a schematic view of the X-Y plane illustrating a second structural example of the layer 220. FIG. 8 is a schematic view of the X-Z cross section illustrating the second structural example of the layer 220.

The layer 220 may be formed in a striped pattern in the region 210a along the X-Y plane, as illustrated in FIG. 7. The layer 220 is not formed in a region 210b in this example. By not forming the layer 220 in the region 210b, it is possible to prevent the layer 220 from peeling off from the substrate 210 even when warpage occurs. The layer 220 in a striped pattern extends in the Y-axis direction. In FIG. 7, the width L1 of the region 210b is not particularly limited, and may be, for example, 100 μm or less. A distance D1 between the adjacent layers 220 in the X-axis direction is not particularly limited, and may be, for example, in a range of 0.25 μm to 3 μm. The width D2 of the layer 220 in the X-axis direction is not particularly limited, and may be, for example, in a range of 0.25 μm to 3 μm.

As illustrated in FIG. 8, the thickness L2 of the portion of the substrate 210 facing the lower surface of the layer 220 is not particularly limited, and may be, for example, 1 μm or less. The ratio (aspect ratio) of the thickness of the layer 220 in the Z-axis direction to the width in the X-axis direction is not particularly limited, and may be, for example, 3 or less.

Figure 9:
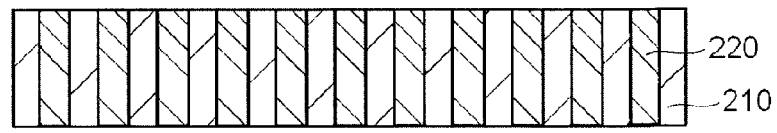
FIG. 9 is a schematic view of the X-Z cross section illustrating a modification example of the second structural example of the layer.

FIG. 9 is a schematic view of the X-Z cross section illustrating a modification example of the second structural example of the layer 220. The layer 220 may penetrate the substrate 210 in the Z-axis direction, as illustrated in FIG. 9. By increasing the volume of the layer 220, the warpage of the substrate 210 can be further reduced. The structure illustrated in FIG. 9 may be applied when the memory pillar MP is electrically coupled to the conductive layer 211 as in the semiconductor device 1 illustrated in FIG. 1, for example.

A structure having the layer 220 in a striped pattern extending in the Y-axis direction as illustrated in FIG. 7 can effectively reduce warpage in the Y-axis direction. Therefore, it is suitable when the semiconductor device 1 warps upward (the substrate 210 side) in a convex shape in the Y-axis direction, or warps downward (the substrate 200 side) in a convex shape in the Y-axis direction.

Third Structural Example of Layer 220

Figure 10:
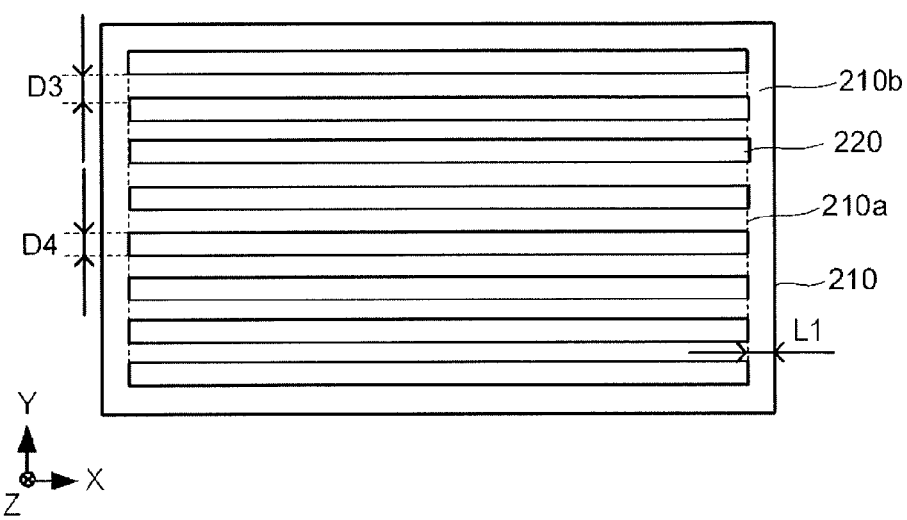
FIG. 10 is a schematic view of the X-Y plane illustrating a third structural example of the layer.
Figure 11:
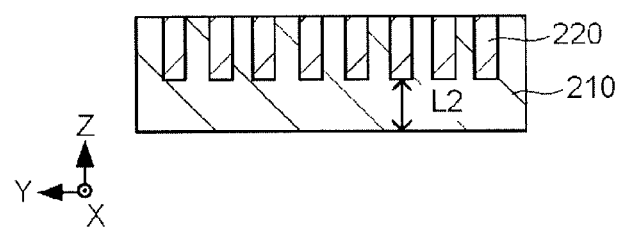
FIG. 11 is a schematic view of a Y-Z cross section illustrating the third structural example of the layer.

FIG. 10 is a schematic view of the X-Y plane illustrating a third structural example of the layer 220. FIG. 11 is a schematic view of a Y-Z cross section illustrating a third structural example of the layer 220.

The layer 220 may be formed in a striped pattern in the region 210a, as illustrated in FIG. 10. In this example, the layer 220 is not formed in the region 210b. The layer 220 in a striped pattern extends in the X-axis direction. In FIG. 10, the width L1 of the region 210b is not particularly limited, and may be, for example, 100 μm or less. Further, a distance D3 between the adjacent layers 220 in the Y-axis direction is not particularly limited, and may be, for example, in a range of 0.25 μm to 3 μm. The width D4 of the layer 220 in the Y-axis direction is not particularly limited, and may be, for example, in a range of 0.25 μm to 3 μm.

As illustrated in FIG. 11, the thickness L2 of the portion of the substrate 210 facing the lower surface of the layer 220 is not particularly limited, and may be, for example, 1 μm or less. The ratio (aspect ratio) of the thickness of the layer 220 in the Z-axis direction to the width in the Y-axis direction is not particularly limited, and may be, for example, 3 or less.

Figure 12:
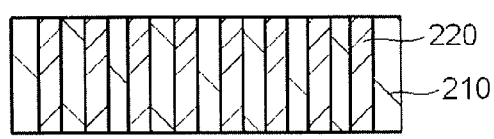
FIG. 12 is a schematic view of the Y-Z cross section illustrating a modification example of the third structural example of the layer.

FIG. 12 is a schematic view of the Y-Z cross section illustrating a modification example of the third structural example of the layer 220. The layer 220 may penetrate the substrate 210 in the Z-axis direction, as illustrated in FIG. 12. By increasing the volume of the layer 220, the warpage of the substrate 210 can be further reduced. The structure illustrated in FIG. 12 may be applied when the memory pillar MP is electrically coupled to the conductive layer 211 as in the semiconductor device 1 illustrated in FIG. 1, for example.

A structure having the layer 220 in a striped pattern extending in the X-axis direction as illustrated in FIG. 10 can effectively reduce warpage in the X-axis direction. Therefore, for example, it is suitable when the semiconductor device 1 warps upward (to the substrate 210 side) in a convex shape in the X-axis direction, or warps downward (to the substrate 200 side) in a convex shape in the X-axis direction.

Fourth Structural Example of Layer 220

Figure 13:
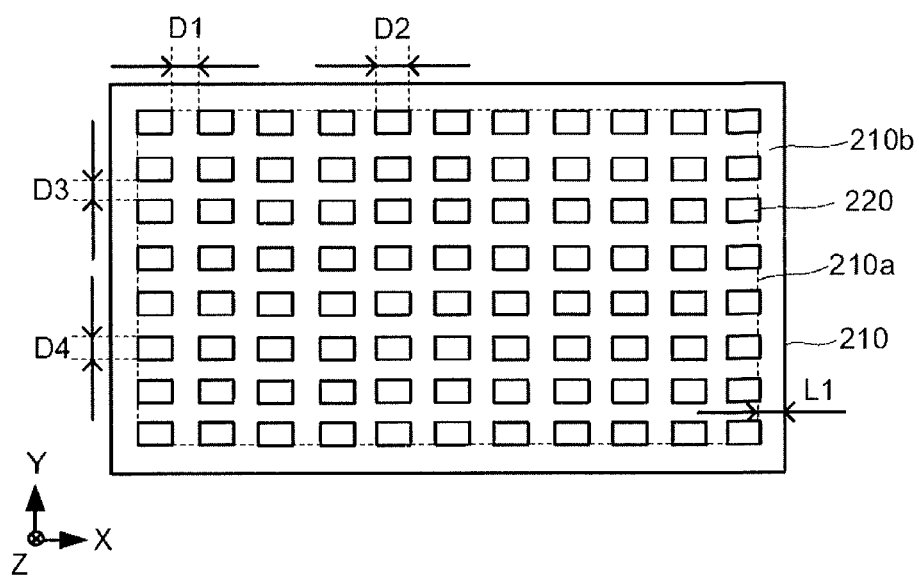
FIG. 13 is a schematic view of the X-Y plane illustrating a fourth structural example of the layer.

FIG. 13 is a schematic view of the X-Y plane illustrating a fourth structural example of the layer 220. Since the X-Z cross section of the layer 220 is the same as that in FIG. 8 or 9, the illustration of this aspect of the fourth structural example is omitted. The Y-Z cross section of the layer 220 in this fourth structural example is the same as that of FIG. 11 or 12.

The layer 220 may be formed in a dotted pattern (e.g., a grid array) in the region 210a, as illustrated in FIG. 13. In this example, the layer 220 is not formed in the region 210b. In FIG. 13, the width L1 of the region 210b is not particularly limited, and may be, for example, 100 μm or less. The distance D1 between the adjacent layers 220 in the X-axis direction is not particularly limited, and may be, for example, in a range of 0.25 μm to 3 μm. The width D2 of each layer 220 in the X-axis direction is not particularly limited, and may be, for example, in a range of 0.25 μm to 3 μm. The distance D3 between the adjacent layers 220 in the Y-axis direction is not particularly limited, and may be, for example, in a range of 0.25 μm to 3 μm or. Likewise, the width D4 of the layer 220 in the Y-axis direction is not particularly limited, and may be, for example, in a range of 0.25 μm to 3 μm.

The thickness L2 of the portion of the substrate 210 facing the lower surface of the layer 220 is not particularly limited, and may be, for example, 1 μm or less. The ratio (aspect ratio) of the thickness of the layer 220 in the Z-axis direction to the width in the X-axis direction is not particularly limited, and may be, for example, 3 or less. Further, the ratio (aspect ratio) of the thickness of the layer 220 in the Z-axis direction to the width in the Y-axis direction is not particularly limited, and may be, for example, 3 or less.

The layer 220 may penetrate the substrate 210 in the Z-axis direction. By increasing the volume of the layer 220, the warpage of the substrate 210 can be further reduced. The above structure may be applied when the memory pillar MP is electrically coupled to the conductive layer 211 as in the semiconductor device 1 illustrated in FIG. 1, for example.

A structure having the layer 220 in a dotted pattern in the region 210a as illustrated in FIG. 13 can be used to effectively reduce warpage in both the X-axis direction and the Y-axis direction. Therefore, it is suitable when the semiconductor device 1 warps upward (the substrate 210 side) in a convex shape in one direction of the X-axis direction and the Y-axis direction, and at the same time, the semiconductor device 1 warps downward (the substrate 200 side) in a concave shape in the other direction of the X-axis direction and the Y-axis direction. Furthermore, by forming the layer 220 in a dotted pattern, it is possible to reduce the decrease in the mechanical strength of the substrate 210.

Example of First Plane Layout of Layer 220

Figure 14:
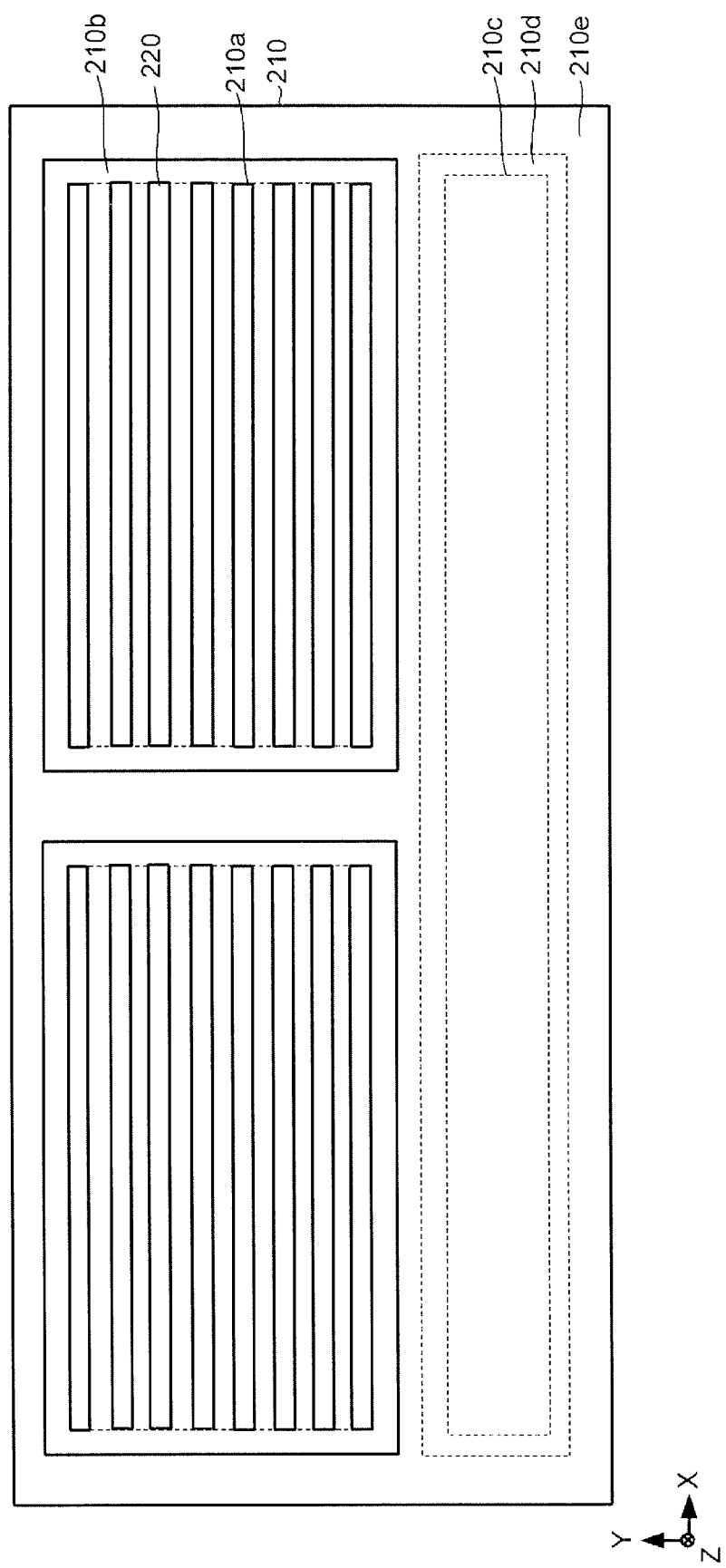
FIG. 14 is a schematic view of the X-Y plane illustrating a first plane layout example of the layer.

FIG. 14 is a schematic view of the X-Y plane illustrating a first plane layout example of the layer 220. As illustrated in FIG. 14, the layer 220 may be formed in a plurality of regions 210a, 210C, 210d, and 210e on the substrate 210. In this example, the layer 220 is not formed in the region 210b on the substrate 210. For the shape of the layer 220 in the region 210a, for example, any of the first to fourth structural examples of the layer 220 may be applied.

Each of the regions 210a overlaps the corresponding memory cell array in the Z-axis direction. Therefore, each region 210a corresponds to a plane constituting a memory core. The number of regions 210a is not limited to the number of regions 210a illustrated in FIG. 14.

The region 210c overlaps the peripheral circuit in the Z-axis direction. The conductive layer 218 illustrated in FIG. 1 may be electrically coupled to the conductive layer 211 via, for example, the region 210c.

The region 210d surrounds the region 210c in the X-Y plane.

The region 210e surrounds the region 210a, the region 210b, the region 210c, and the region 210d in the X-Y plane.

As illustrated in FIG. 14, by forming the layer 220 in each of the plurality of regions 210a, 210c, 210d, and 210e, the effect of reducing warpage can be enhanced.

Example of Second Plane Layout of Layer 220

Figure 15:
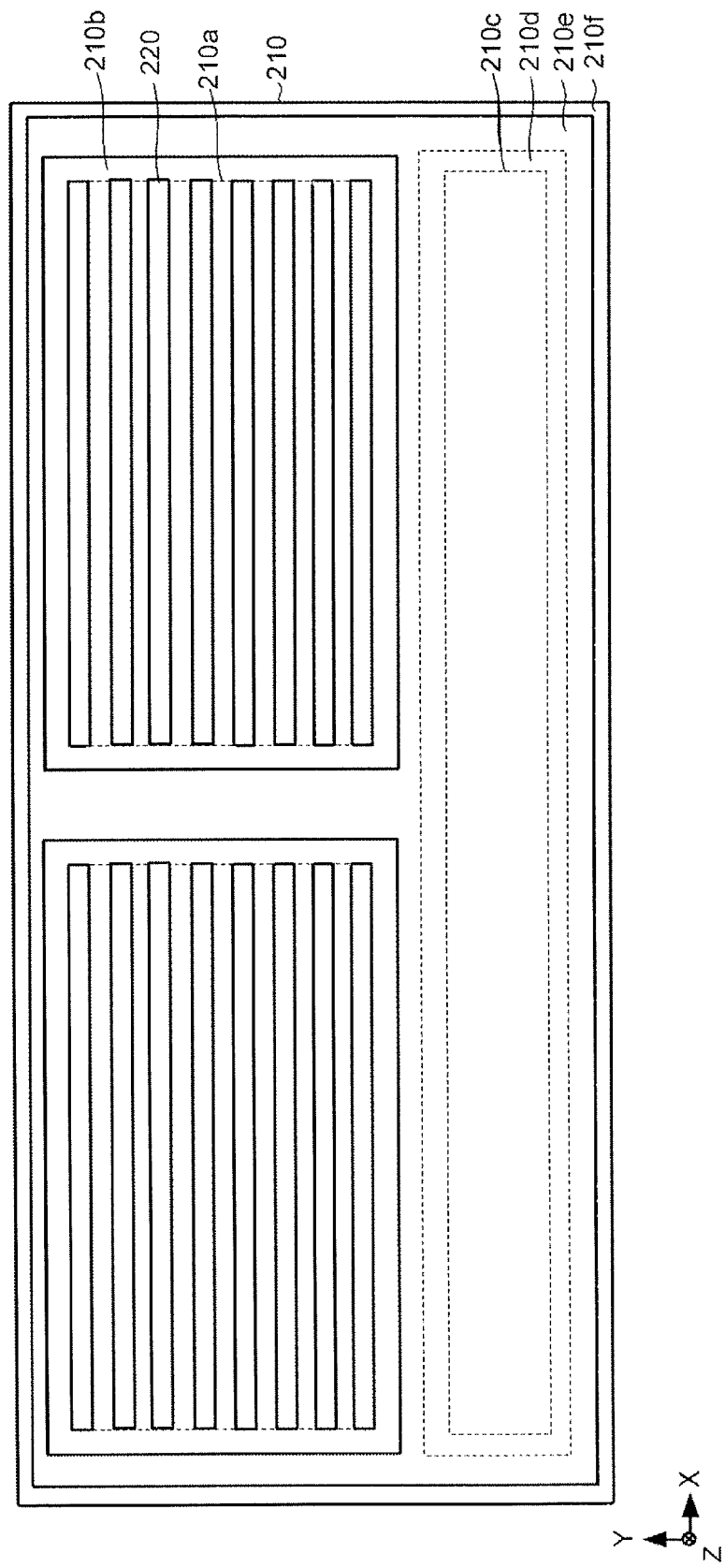
FIG. 15 is a schematic view of the X-Y plane illustrating a second plane layout example of the layer.

FIG. 15 is a schematic view of the X-Y plane illustrating a second plane layout example of the layer 220. The second plane layout example is different from the first plane layout example in that the layer 220 is not formed in a region 210f surrounding the region 210e. For other parts, the description corresponds to that of the first plane layout described above.

The region 210f is, for example, a peripheral portion of a chip forming the semiconductor device 1. As illustrated in FIG. 15, by not forming the layer 220 in the region 210f, it is possible to prevent the layer 220 from peeling off from the substrate 210 even when warpage occurs.

Example of Third Plane Layout of Layer 220

Figure 16:
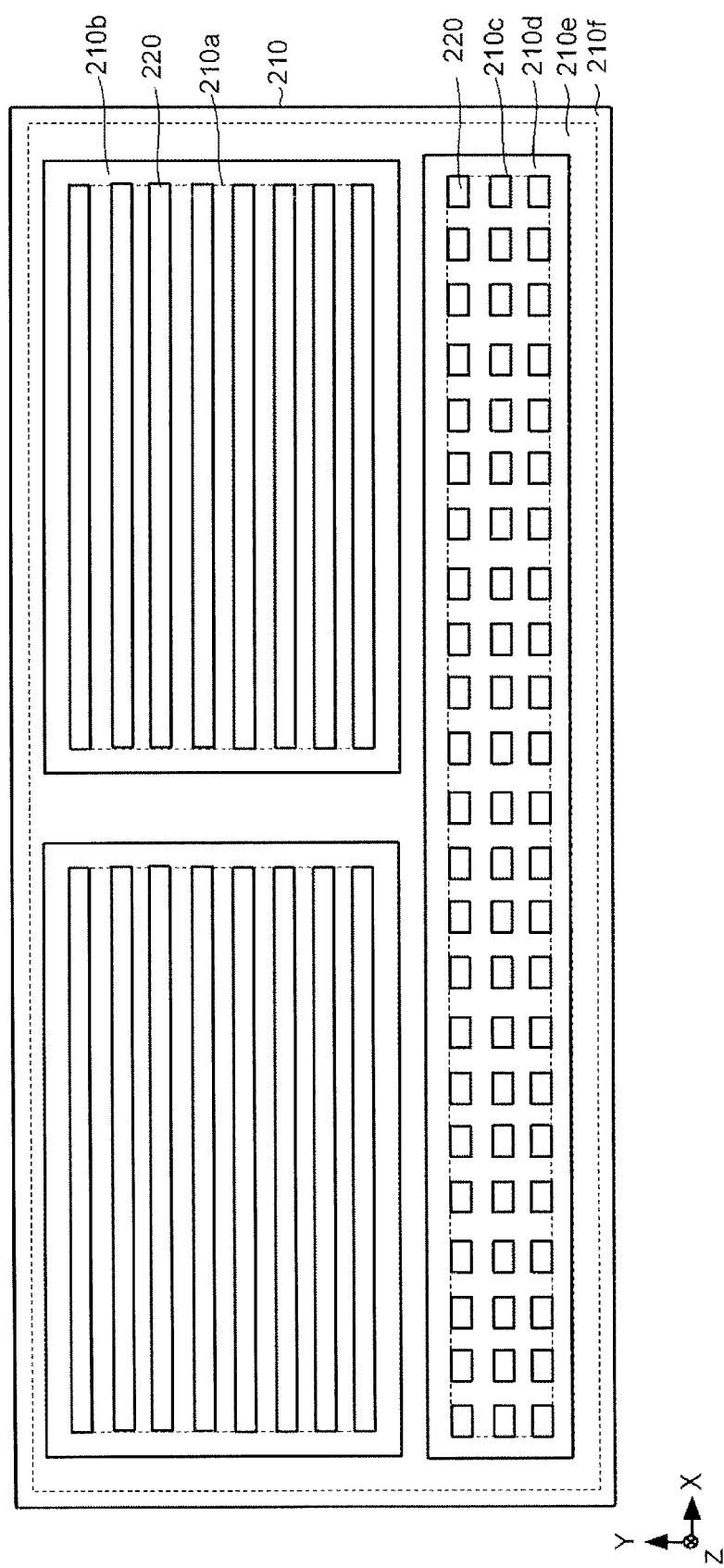
FIG. 16 is a schematic view of the X-Y plane illustrating a third plane layout example of the layer.

FIG. 16 is a schematic view of the X-Y plane illustrating a third plane layout example of the layer 220. The layer 220 may be formed in the regions 210a, 210c, and 210e, as illustrated in FIG. 16. In this example, the layer 220 is not formed in the region 210a and the region 210d. In the X-Y plane, the regions 210a and 210C may have different planar shapes of the layer 220. For the shape of the layer 220 in the region 210c, for example, any of the first structural example to fourth structural example of the layer 220 may be applied. The description of the first plane layout example may be appropriately incorporated for the same part as the first plane layout example.

As illustrated in FIG. 16, by forming the layer 220 having different planar shapes between the region 210a and the region 210c, even when the warped state is different for each region, a shape suitable for each state may be selected, thereby enhancing the effect of reducing warpage.

Thus, the first plane layout example to the third plane layout example may be combined as appropriate.

Example of Manufacturing Method of Semiconductor Device

FIGS. 17 to 22 are schematic views of the X-Z cross section illustrating aspects related to an example of a manufacturing method of a semiconductor device. A manufacturing method of the semiconductor device 1 illustrated in FIG. 1 will be described as one example.

Figure 17:
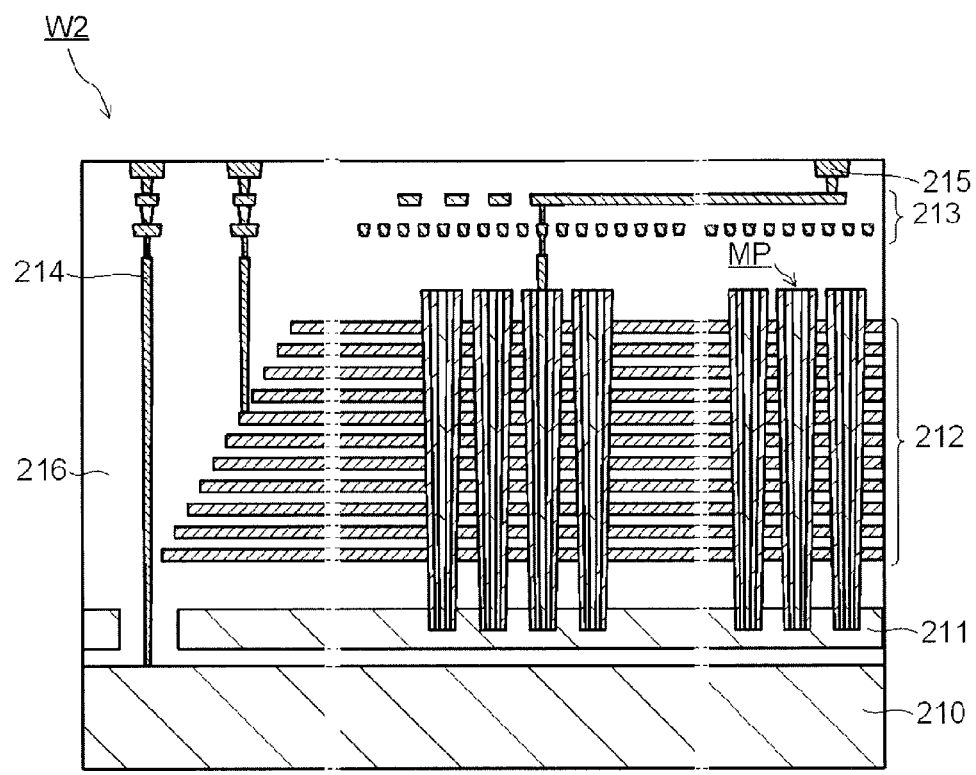
FIG. 17 is a schematic view of the X-Z cross section illustrating aspects of a manufacturing method of a semiconductor device.
Figure 17:
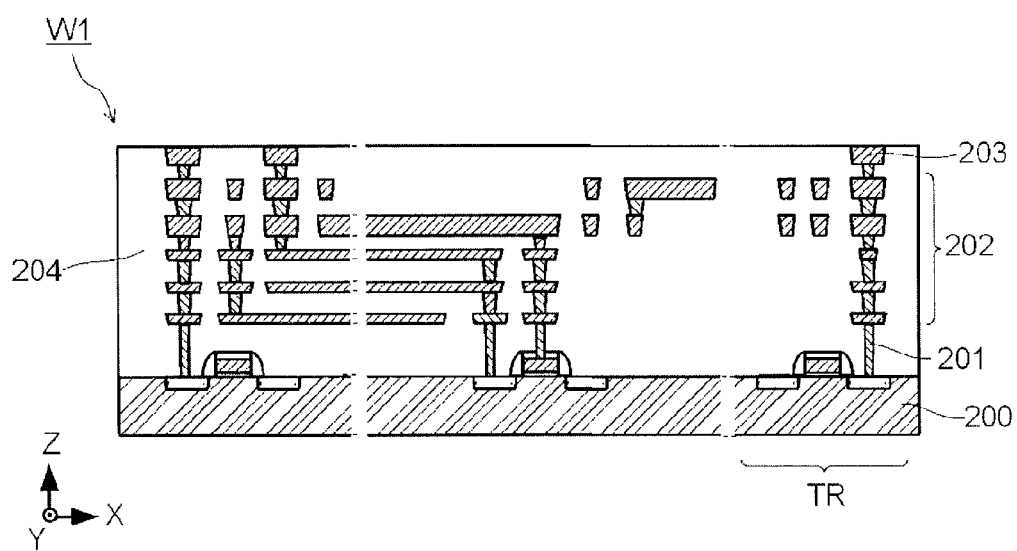

First, as illustrated in FIG. 17, a wafer W1 and a wafer W2 are separately prepared.

The wafer W1 can be prepared by forming the transistor TR on the substrate 200 and then forming the conductive layer 201, the multilayer wiring 202, the conductive layer 203, and the interlayer insulating film 204 on the substrate 200.

The wafer W2 can be prepared by forming the conductive layer 211, the stacked body 212, the memory pillar MP, the multilayer wiring 213, the conductive layer 214, the conductive layer 215, and the interlayer insulating film 216 on the substrate 210.

Figure 18:
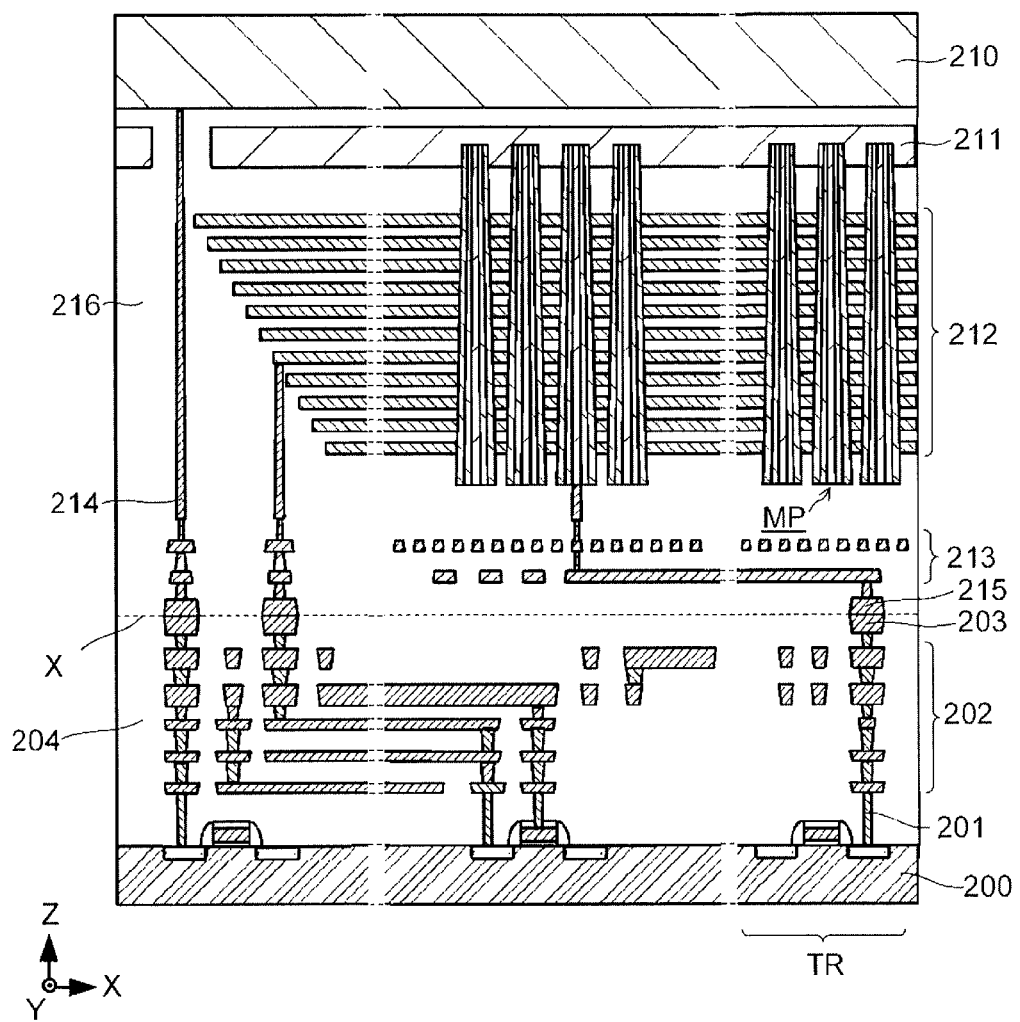
FIG. 18 is a schematic view of the X-Z cross section illustrating aspects of a manufacturing method of a semiconductor device.

Next, as illustrated in FIG. 18, the orientation of the wafer W2 is reversed (flipped), and the wafer W1 and the wafer W2 are attached together. In this context, "attached" means that the wafer W1 and the wafer W2 are brought into close contact with each other before a heat treatment process or the like.

Thereafter, the wafer W1 and the wafer W2 are joined. In the present context, "joined" means that the wafer W1 and the wafer W2 are firmly fixed to one another and may be said to be bonded or the like. The wafer W1 and the wafer W2 are joined by, for example, a heat treatment. The conductive layer 203 and the conductive layer 215 are directly joined by, for example, element diffusion between metals, Van Der Waals forces, recrystallization by volume expansion or melting, or the like. Further, the wafer W1 and the wafer W2 can be joined by element diffusion between the interlayer insulating film 204 and the interlayer insulating film 216, Van Der Waals forces, direct joining by a chemical reaction such as dehydration condensation and polymerization, or by joining between a metal and an insulating layer. This joining method is also called hybrid bonding. Although FIG. 18 illustrates an interface (bonding surface) "X" between the wafer W1 and the wafer W2, the interface X may not be clearly observable or distinguishable after the heat treatment.

Figure 19:
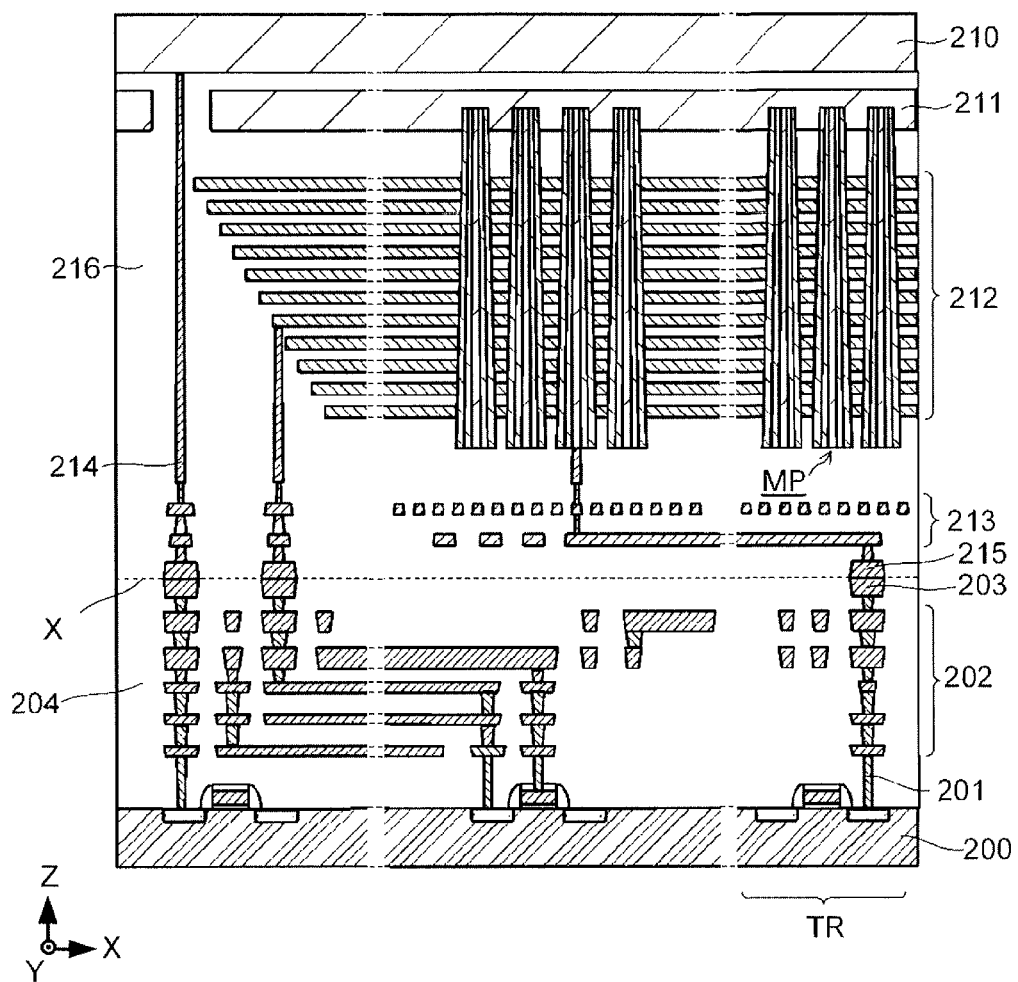
FIG. 19 is a schematic view of the X-Z cross section illustrating aspects of a manufacturing method of a semiconductor device.

Next, as illustrated in FIG. 19, the substrate 210 is thinned by partially removing portions of the substrate 210. The substrate 210 can be partially thinned, for example, by wet etching. It is preferable to thin the substrate 210 so that the well region of the substrate 210 still remains after the thinning.

Figure 20:
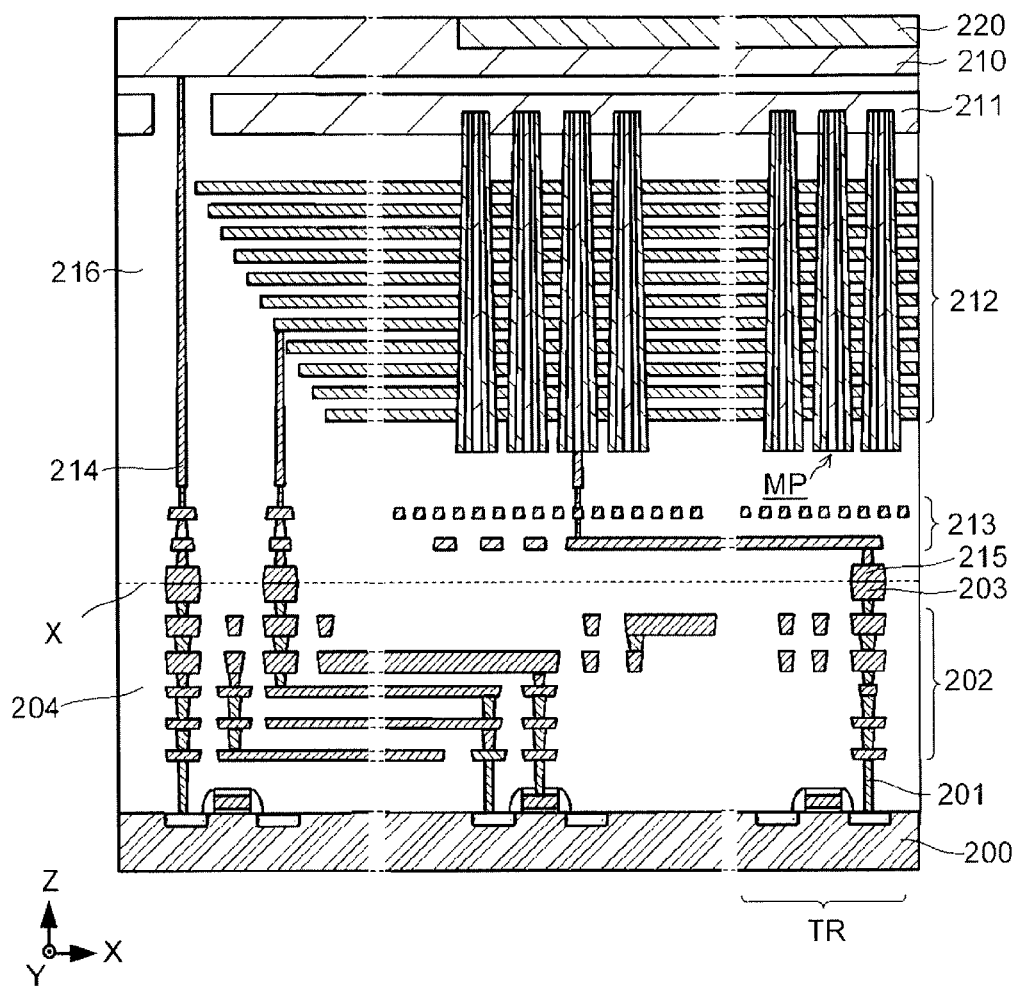
FIG. 20 is a schematic view of the X-Z cross section illustrating aspects of a manufacturing method of a semiconductor device.

Next, the layer 220 is formed as illustrated in FIG. 20. The layer 220 is formed in this example by partially removing the substrate 210 to form recessed portions in the substrate 210 and then filling (embedding) a material layer corresponding to the layer 220 into the recessed portions. The substrate 210 can be partially removed by using, for example, reactive ion etching (RIE). The layer 220 may be formed, for example, by chemical vapor deposition (CVD) or sputtering, depending on the material used. The planar shape of the layer 220 can be controlled by, for example, the shape of a photomask pattern using when forming the recessed portions by photolithographic methods or the like.

Figure 21:
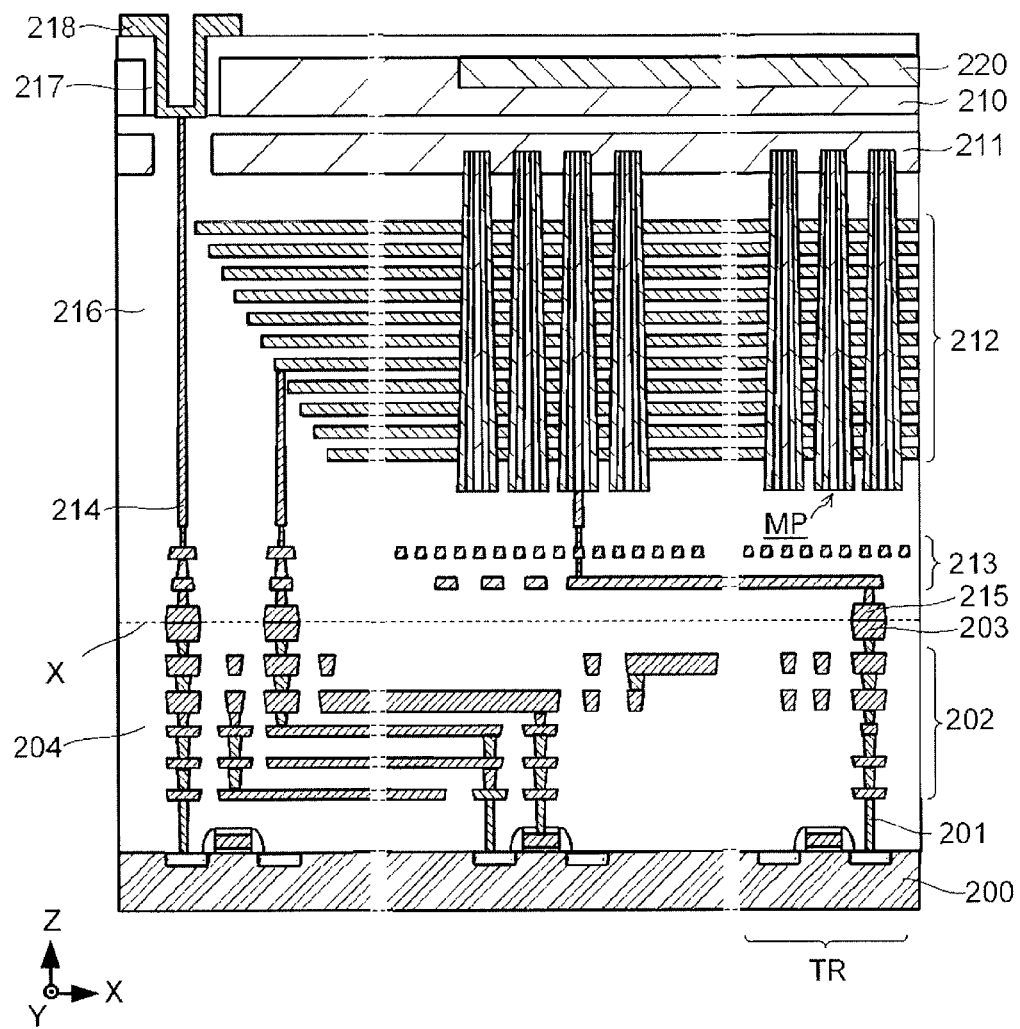
FIG. 21 is a schematic view of the X-Z cross section illustrating aspects of a manufacturing method of a semiconductor device.

Next, as illustrated in FIG. 21, the interlayer insulating film 217 and the conductive layer 218 are formed in this order. The interlayer insulating film 217 is formed after the plug of the conductive layer 214 is partially exposed by partially removing the substrate 210 to form an opening. The interlayer insulating film 217 may be formed by using, for example, CVD. The substrate 210 can be partially removed by using, for example, RIE. The conductive layer 218 is formed after the interlayer insulating film 217 is partially removed to expose the plug of the conductive layer 214. The conductive layer 218 may be formed by using, for example, sputtering.

Figure 22:
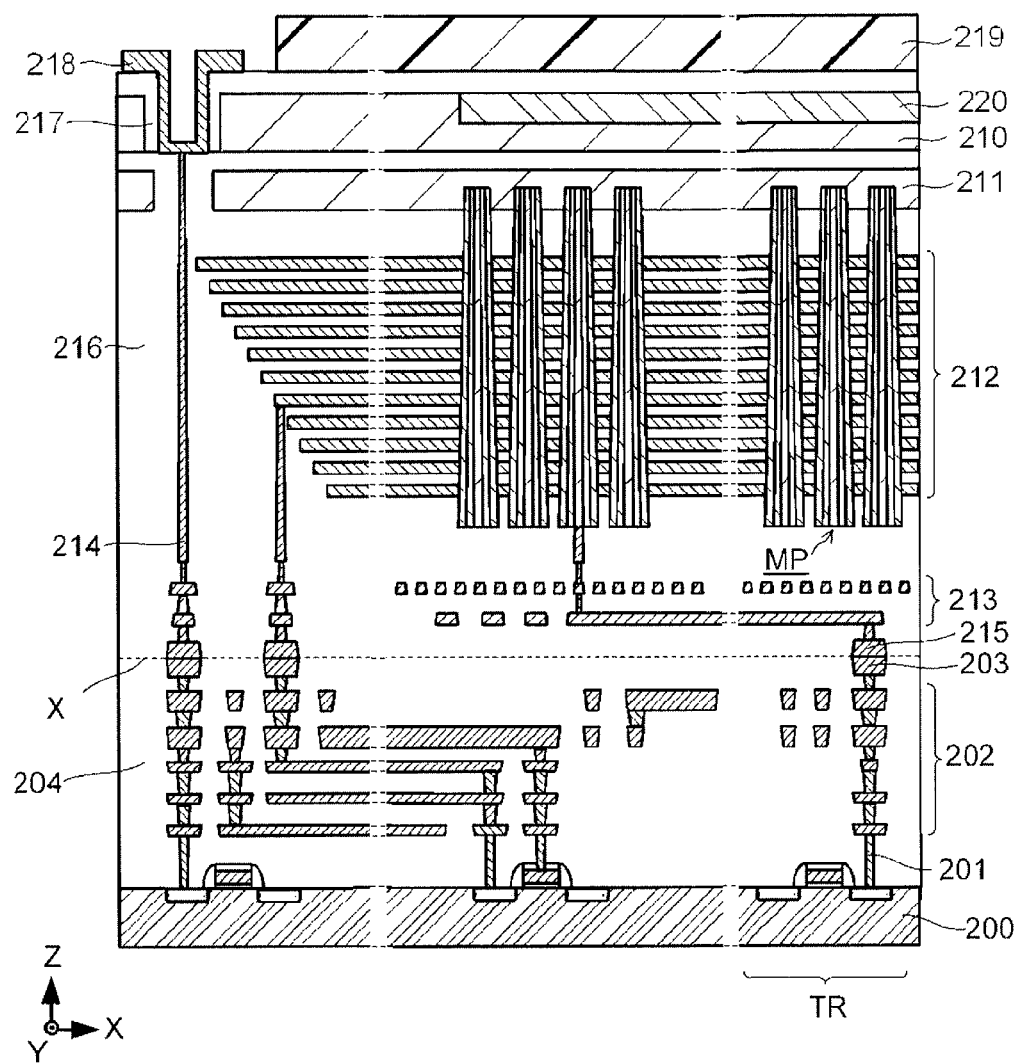
FIG. 22 is a schematic view of the X-Z cross section illustrating aspects of a manufacturing method of a semiconductor device.

Next, as illustrated in FIG. 22, the passivation film 219 is formed. The passivation film 219 may be formed by using, for example, CVD or sputtering. At least a portion of the conductive layer 218 can be exposed by partially removing the passivation film 219.

Then, the wafer W1 and the wafer W2 are cut into a plurality of individual chips by dicing. The semiconductor device 1 may be manufactured by the above process, but the above is the description of one example of the manufacturing method of the semiconductor device 1.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
a first substrate;
a second substrate joined to the first substrate, the second substrate being a silicon substrate;
a first region that includes a peripheral circuit between the first substrate and the second substrate;
a second region that includes a memory cell array between the first region and the second substrate; and
a layer that is embedded in the second substrate in a region overlapping the memory cell array, the layer having a Young's modulus higher than that of silicon or an internal stress higher than that of silicon oxide.

2. The semiconductor device according to claim 1, wherein the second substrate surrounds the layer at a surface of the second substrate facing away from the first substrate.

3. The semiconductor device according to claim 1, wherein the layer is provided in a striped pattern.

4. The semiconductor device according to claim 1, wherein the layer is provided in a dotted pattern.

5. The semiconductor device according to claim 1, wherein the layer penetrates the entire thickness of the second substrate.

6. The semiconductor device according to claim 1, wherein the layer does not penetrate the entire thickness of the second substrate such that a part of the second substrate is between the layer and the memory cell array.

7. The semiconductor device according to claim 1, wherein the layer has a tensile stress higher than that of silicon oxide.

8. The semiconductor device according to claim 1, wherein the layer has a compressive stress higher than that of silicon oxide.

9. The semiconductor device according to claim 1, wherein the layer comprises silicon nitride.

10. The semiconductor device according to claim 1, wherein the layer comprises a metal oxide.

11. The semiconductor device according to claim 10, wherein the metal oxide is one of an aluminum oxide, a titanium oxide, a zirconium oxide, or a hafnium oxide.

12. The semiconductor device according to claim 1, wherein the layer comprises a metal nitride.

13. The semiconductor device according to claim 12, wherein the metal nitride is one of an aluminum nitride, a titanium nitride, or a tantalum nitride.

14. The semiconductor device according to claim 1, wherein the layer comprises a metal.

15. The semiconductor device according to claim 14, wherein the metal is one of tungsten, titanium, aluminum, copper, molybdenum, or tantalum.

16. A semiconductor device, comprising:
a first substrate;
a second substrate joined to the first substrate, the second substrate being a silicon substrate;
a first region that includes a peripheral circuit between the first substrate and the second substrate;
a second region that includes a memory cell array between the first region and the second substrate;
a first layer that is embedded in the second substrate and overlapping the memory cell array, the first layer having a Young's modulus higher than that of silicon or an internal stress higher than that of silicon oxide; and
a second layer that is embedded in the second substrate and overlapping the peripheral circuit, the second layer having a Young's modulus higher than that of silicon or an internal stress higher than that of a silicon oxide, wherein
a planar shape of the second layer at a surface of the second substrate is different from a planar shape of the first layer at the surface of the second substrate.

17. The semiconductor device according to claim 16, wherein
the first layer only partially overlaps the memory cell array, and
the second layer entirely overlaps the peripheral circuit.

18. The semiconductor device according to claim 16, wherein
the planar shape of the first layer is a striped pattern, and
the planar shape of the second layer is a dotted pattern.

19. The semiconductor device according to claim 16, wherein the second substrate surrounds the first layer and the second layer at a surface of the second substrate facing away from the first substrate.

20. The semiconductor device according to claim 16, wherein
the first layer is one of silicon nitride, metal oxide, metal nitride, or metal, and
the second layer is one of silicon nitride, metal oxide, metal nitride, or metal.

* * * * *